(12) United States Patent
Chelle et al.

(10) Patent No.: US 8,057,696 B2
(45) Date of Patent: Nov. 15, 2011

(54) COMPOSITIONS AND METHODS FOR RAPIDLY REMOVING OVERFILLED SUBSTRATES

(75) Inventors: Philippe H. Chelle, Fremont, CA (US); Robert J. Small, Tucson, AZ (US)

(73) Assignee: DuPont Air Products NanoMaterials LLC, Tempe, AZ (US)

( * ) Notice: Subject to any disclaimer, the term of this patent is extended or adjusted under 35 U.S.C. 154(b) by 458 days.

(21) Appl. No.: 12/201,459

(22) Filed: Aug. 29, 2008

(65) Prior Publication Data

US 2009/0014415 A1    Jan. 15, 2009

Related U.S. Application Data

(63) Continuation of application No. 10/984,820, filed on Nov. 10, 2004, now Pat. No. 7,419,911.

(60) Provisional application No. 60/518,337, filed on Nov. 10, 2003.

(51) Int. Cl.
*C09G 1/02* (2006.01)

(52) U.S. Cl. ......... 252/79.1; 438/492; 510/175; 216/89; 51/308

(58) Field of Classification Search ................. 252/79.1; 438/692; 510/175; 216/89; 51/308
See application file for complete search history.

(56) References Cited

U.S. PATENT DOCUMENTS

| | | | |
|---|---|---|---|
| 4,789,674 A | 12/1988 | Paioni | |
| 5,279,771 A | 1/1994 | Lee | |
| 5,334,332 A | 8/1994 | Lee | |
| 5,399,464 A | 3/1995 | Lee | |
| 5,417,877 A | 5/1995 | Ward | |
| 5,482,566 A | 1/1996 | Lee | |
| 5,489,233 A | 2/1996 | Cook et al. | |
| 5,498,565 A | 3/1996 | Gocho et al. | |
| 5,672,577 A | 9/1997 | Lee | |
| 5,721,173 A | 2/1998 | Yano et al. | |
| 5,891,205 A | 4/1999 | Picardi et al. | |
| 5,902,780 A | 5/1999 | Lee | |
| 5,911,835 A | 6/1999 | Lee et al. | |
| 5,938,505 A | 8/1999 | Morrison et al. | |
| 5,958,794 A | 9/1999 | Bruxvoort et al. | |
| 5,981,454 A | 11/1999 | Small | |
| 5,993,686 A | 11/1999 | Streinz et al. | |
| 6,000,411 A | 12/1999 | Lee | |
| 6,019,806 A | 2/2000 | Sees et al. | |
| 6,063,306 A | 5/2000 | Kaufman et al. | |
| 6,110,881 A | 8/2000 | Lee et al. | |
| 6,117,783 A | 9/2000 | Small et al. | |
| 6,121,217 A | 9/2000 | Lee | |
| 6,140,287 A | 10/2000 | Lee | |
| 6,156,661 A | 12/2000 | Small | |
| 6,187,730 B1 | 2/2001 | Lee | |
| 6,217,416 B1 | 4/2001 | Kaufman et al. | |
| 6,221,818 B1 | 4/2001 | Lee | |
| 6,235,693 B1 | 5/2001 | Cheng et al. | |
| 6,242,351 B1 * | 6/2001 | Li et al. | 438/690 |
| 6,242,400 B1 | 6/2001 | Lee | |
| 6,248,704 B1 | 6/2001 | Small et al. | |
| 6,251,150 B1 | 6/2001 | Small et al. | |
| 6,276,372 B1 | 8/2001 | Lee | |
| 6,315,803 B1 | 11/2001 | Ina et al. | |
| 6,316,365 B1 * | 11/2001 | Wang et al. | 438/692 |
| 6,355,075 B1 | 3/2002 | Ina et al. | |
| 6,362,106 B1 * | 3/2002 | Kaufman et al. | 438/692 |
| 6,367,486 B1 | 4/2002 | Lee et al. | |
| 6,569,349 B1 | 5/2003 | Wang et al. | |
| 6,620,215 B2 | 9/2003 | Li et al. | |
| 6,692,546 B2 | 2/2004 | Ma et al. | |
| 6,774,041 B1 | 8/2004 | Kondo et al. | |
| 6,800,218 B2 | 10/2004 | Ma et al. | |
| 7,029,373 B2 | 4/2006 | Ma et al. | |
| 7,029,508 B2 | 4/2006 | Scott et al. | |
| 7,419,911 B2 * | 9/2008 | Chelle et al. | 438/692 |
| 2001/0041507 A1 | 11/2001 | Kaufman et al. | |
| 2002/0111024 A1 | 8/2002 | Small et al. | |
| 2002/0145127 A1 * | 10/2002 | Kaufman et al. | 252/79.1 |
| 2002/0173221 A1 | 11/2002 | Li et al. | |
| 2003/0047539 A1 | 3/2003 | Ma et al. | |
| 2003/0060145 A1 * | 3/2003 | Li et al. | 451/66 |
| 2003/0073386 A1 | 4/2003 | Ma et al. | |
| 2003/0077985 A1 * | 4/2003 | Zhou et al. | 451/41 |
| 2003/0134575 A1 * | 7/2003 | Fang | 451/41 |
| 2003/0136055 A1 | 7/2003 | Li et al. | |
| 2003/0162398 A1 | 8/2003 | Small et al. | |
| 2003/0164471 A1 | 9/2003 | Small et al. | |
| 2004/0007690 A1 * | 1/2004 | Snider et al. | 252/79.1 |
| 2004/0023492 A1 * | 2/2004 | Bian et al. | 438/689 |
| 2005/0178742 A1 * | 8/2005 | Chelle et al. | 216/88 |
| 2006/0289034 A1 * | 12/2006 | Small et al. | 134/1.3 |
| 2008/0203059 A1 * | 8/2008 | De Rege Thesauro et al. | 216/89 |
| 2009/0014415 A1 * | 1/2009 | Chelle et al. | 216/53 |
| 2010/0167546 A1 * | 7/2010 | Shi et al. | 438/693 |

* cited by examiner

*Primary Examiner* — Gregory Webb

(74) *Attorney, Agent, or Firm* — Geoffrey L. Chase; John R. Dodd; Christopher G. Hayden

(57) ABSTRACT

This invention relates to compositions and methods for removing overfilled substrates, preferably at a relatively high removal rates. Advantageously, a composition according to the invention can contain an oxidizer, preferably a per-type oxidizer such as a peroxide, periodic acid, and peracetic acid, and may also optionally contain an abrasive.

20 Claims, No Drawings

COMPOSITIONS AND METHODS FOR RAPIDLY REMOVING OVERFILLED SUBSTRATES

This application is a continuation of pending application Ser. No. 10/984,820 filed on Nov. 10, 2004, now U.S. Pat. No. 7,419,911, and further claims priority to U.S. Provisional Application Ser. No. 60/518,337 filed on Nov. 10, 2003, the disclosures of which are incorporated herein for all legal purposes.

FIELD OF THE INVENTION

This invention relates to compositions and methods for removing overfilled substrates, preferably at a relatively high removal rates.

BACKGROUND OF THE INVENTION

Conventional polishing systems and polishing methods typically are not entirely satisfactory at planarizing substrates. In particular, polishing compositions and polishing pads can have less than desirable polishing rates, and their use in chemically-mechanically polishing surfaces can result in poor surface quality. Because the performance of, for example, a semiconductor water is directly associated with the planarity of its surface and its low defectivity, it is crucial to use a polishing composition and method that results in a high polishing efficiency, uniformity, and removal rate, and leaves a high quality polish with minimal surface defects.

One problem with chemical mechanical polishing is that formulations are designed for controlled substrate removal rates, where the maximum practical removal rate is about 6000 Angstroms per minute, as at rates above this planarity suffers and it is difficult to stop the process at the precise time. However, in certain manufacturing processes, there is occasionally large excesses of metal put on a wafer, and removing these excesses with the formulations developed for very controlled substrate removal at intermediate rates creates an economically unfavorable processing time. Large excesses of metal, e.g., copper, are found in for example copper oversputter methodologies. Overfilled and/or oversputtered substrates are also well known in the art. An example of these substrates, as well as issues associated with their fabrication, can be found in U.S. Pat. No. 4,789,674, which is hereby incorporated by reference in its entirety.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

A variety of chemical mechanical polishing and/or residue removal compositions and processes suitable for integrated circuit fabrication have been developed and marketed by EKC Technology, Inc. (hereinafter "EKC"), the assignee of the present application. Some of these compositions and processes are also useful for removing photoresist, polyimide, or other polymeric layers from substrates in integrated circuit fabrication, and EKC has also developed a variety of compositions and processes specifically for removing such polymeric layers from substrates in integrated circuit fabrication. Additionally, EKC has developed a variety of compositions and processes to selectively remove specific substrate compositions from a substrate surface at a controlled rate. Such compositions and processes are disclosed in the following commonly assigned issued patents:

U.S. Pat. No. 6,367,486 to Lee et al., which issued on Apr. 9, 2002, entitled Ethylenediaminetetraacetic acid or its ammonium salt semiconductor process residue removal process;

U.S. Pat. No. 6,313,039 to Small et al., which issued on Nov. 6, 2001, entitled Chemical mechanical polishing composition and process;

U.S. Pat. No. 6,276,372 to Lee, which issued on Aug. 21, 2001, entitled Process using hydroxylamine-gallic acid composition;

U.S. Pat. No. 6,251,150 to Small et al., which issued on Jun. 26, 2001, entitled Slurry composition and method of chemical mechanical polishing using same;

U.S. Pat. No. 6,248,704 to Small et al., which issued on Jun. 19, 2001, entitled Compositions for cleaning organic and plasma etched residues for semiconductors devices;

U.S. Pat. No. 6,242,400 to Lee, which issued on Jun. 5, 2001, entitled Method of stripping resists from substrates using hydroxylamine and alkanolamine;

U.S. Pat. No. 6,235,693 to Cheng et al., which issued on May 22, 2001, entitled lactam compositions for cleaning organic and plasma etched residues for semiconductor devices;

U.S. Pat. Nos. 6,187,730 and 6,221,818, both to Lee, which issued on Feb. 13, 2001 and on Apr. 24, 2001, respectively, entitled Hydroxylamine-gallic compound composition and process;

U.S. Pat. No. 6,156,661 to Small, which issued on Dec. 5, 2000, entitled Post clean treatment;

U.S. Pat. No. 6,140,287 to Lee, which issued on Oct. 31, 2000, entitled Cleaning compositions for removing etching residue and method of using;

U.S. Pat. No. 6,121,217 to Lee, which issued on Sep. 19, 2000, entitled Alkanolamine semiconductor process residue removal composition and process;

U.S. Pat. No. 6,117,783 to Small et al., which issued on Sep. 12, 2000, entitled Chemical mechanical polishing composition and process;

U.S. Pat. No. 6,110,881 to Lee et al., which issued on Aug. 29, 2000, entitled Cleaning solutions including nucleophilic amine compound having reduction and oxidation potentials:

U.S. Pat. No. 6,000,411 to Lee, which issued on Dec. 14, 1999, entitled Cleaning compositions for removing etching residue and method of using; U.S. Pat. No. 5,981,454 to Small, which issued on Nov. 9, 1999, entitled Post clean treatment composition comprising an organic acid and hydroxylamine;

U.S. Pat. No. 5,911,835 to Lee et al., which issued on Jun. 15, 1999, entitled Method of removing etching residue;

U.S. Pat. No. 5,902,780 to Lee, which issued on May 11, 1999, entitled Cleaning compositions for removing etching residue and method of using;

U.S. Pat. No. 5,891,205 to Picardi et al., which issued on Apr. 6, 1999, entitled Chemical mechanical polishing composition;

U.S. Pat. No. 5,672,577 to Lee, which issued on Sep. 30, 1997, entitled Cleaning compositions for removing etching residue with hydroxylamine, alkanolamine, and chelating agent;

U.S. Pat. No. 5,482,566 to Lee, which issued on Jan. 9, 1996, entitled Method for removing etching residue using a hydroxylamine-containing composition;

U.S. Pat. No. 5,399,464 to Lee, which issued on Mar. 21, 1995, entitled Triamine positive photoresist stripping composition and post-ion implantation baking;

U.S. Pat. No. 5,381,807 to Lee, which issued on Jan. 17, 1995, entitled Method of stripping resists from substrates using hydroxylamine and alkanolamine;

U.S. Pat. No. 5,334,332 to Lee, which issued on Aug. 2, 1994, entitled Cleaning compositions for removing etching residue and method of using;

U.S. Pat. No. 5,279,771 to Lee, which issued on Jan. 18, 1994, entitled Stripping compositions comprising hydroxylamine and alkanolamine;

U.S. Pat. No. 4,824,763 to Lee, which issued on Apr. 25, 1989, entitled Triamine positive photoresist stripping composition and prebaking process; and U.S. Pat. No. 4,395,348 to Lee, which issued on Jul. 26, 1983, entitled Photoresist stripping composition and method.

The entire disclosures of all of the aforementioned EKC publications are incorporated herein for all purposes by express reference thereto. The compositions described therein have achieved substantial success in integrated circuit fabrication applications.

Compositions and methods for planarizing or polishing the surface of a substrate, especially for chemical-mechanical polishing (CMP), are well known in the art. Polishing compositions (also known as polishing slurries if the composition contains an abrasive) typically contain an abrasive material and an oxidizer in an aqueous solution, and are applied to a surface by contacting the surface with the slurry disposed between a moving polishing pad which exerts pressure as well as providing horizontal movement. Typical abrasive materials include silicon oxide, cerium oxide, aluminum oxide, zirconium oxide, and tin oxide. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad. All references, including publications, patent applications, and patents, cited herein are hereby incorporated by reference to the same extent as if each reference were individually and specifically indicated to be incorporated by reference and were set forth in its entirety herein.

In cases where the substrate is associated with integrated circuit manufacture but is not a semiconductor wafer (e.g., a substrate linking multiple wafers or chips, such as one that can provide a conductive link between such wafers/chips through strategically-placed, interconnected metal-containing conduits linking otherwise non-conductive surfaces), surface planarity, regularity, and/or low defectivity constraints may be lessened.

SUMMARY OF THE INVENTION

One aspect of the invention relates to a method for etching and/or chemically mechanically polishing a substrate which method comprises the steps of:

providing a substrate having at least 3 microns thickness of a metal-containing layer, preferably a copper-containing layer, disposed over a predominately non-conductive dielectric layer, wherein the interface between the metal layer and the dielectric layer is textured and may comprise a barrier material, providing a polishing composition capable of polishing, etching, and/or removing the metal-containing layer material at a polishing rate greater than 10 microns/minute, wherein the polishing composition is disposed between a polishing pad and the substrate surface; and movably contacting the polishing composition with the substrate under conditions where at least a portion of the first metal-containing layer is removed, and beneficially progressing to the point where both regions of material having substantially the same composition as the metal-containing layer and regions of material having substantially the same composition as the barrier layer and/or the dielectric layer are exposed on the substrate surface.

By a textured interface it is meant that the substrate comprises the dielectric layer, and this layer has one or more of trenches or holes therein that are filled with the overlying metal layer, e.g., copper, and optionally a thin barrier layer, e.g., Ta, TaN, Ti, TiN, W, TiW, or the like, or combinations thereof. Therefore, as the oversputter is removed, the trenches form wires on the surface, as in the well-known dual damascene process Advantageously, the composition has a removal rate for the metal-containing layer material of from about 15 microns/minute to about 40 microns/minute, more preferably between about 20 microns/minute and 35 microns/minute, e.g., between about 25 microns/minute and about 32 microns/minute. At 10 microns/minute, there is generally little benefit (e.g., in terms of substrate removal rate) to be gained over traditional aggressive CMP-type formulations. At rates over 45 microns/minute, the process is typically too difficult to control.

In one embodiment, the substrate removal is achieved by the steps of:

movably contacting the substrate with a composition disposed between a polishing pad and the substrate, the composition comprising:

from about 0.1% to about 30% by weight of an oxidizer selected from the group consisting of a peroxide, periodic acid, peracetic acid, or a combination thereof;

a majority of a diluent; and optionally from about 0.1% to about 30% by weight of an abrasive, under conditions such as composition flow rates, temperatures, pad pressure, and pad movement relative to the substrate that are normally used for chemical mechanical polishing.

Exemplary conditions of the movably contacting step include one or more of the following: a temperature from about 15° C. to about 90° C., e.g., from about 25° C. to about 50° C.; a composition flow rate from about 20 mL/min to about 500 mL/min, e.g., between about 60 mL/min and about 250 mL/min; where a polishing pad is used in conjunction with the composition and the substrate, a polishing pressure from about 0.1 to about 15 psi, e.g., between about 0.3 psi to about 6 psi; and where a rotating platen is used in conjunction with the composition, the substrate, and optionally a polishing pad, a rotation rate from about 10 rpm to about 400 rpm, e.g., between about 40 rpm and about 180 rpm.

In embodiments where the metal comprises copper and wherein the copper-containing layer removal rate is greater than 10 micron/minute, the composition comprises, consists essentially of, or consists of:

from about 2% to about 14% by weight of an oxidizer selected from the group consisting of a peroxide, periodic acid, peracetic acid, hydroxylamine, a hydroxylamine derivative, a hydroxylamine salt, a hydroxylamine derivative salt, or a combination thereof;

from about 80% to about 97% by weight of water;

from about 0.5% to about 15% by weight of silica, alumina, a metal-coated version thereof or a combination thereof; and optionally, one or more pH controlling agent to adjust the pH value within a range from about 1 to about 6.

In preferred embodiments, the composition comprises, consists essentially of, or consists of: periodic acid; alumina and/or silica abrasive, preferably alumina abrasive; a nitrate, phosphate, and/or sulfate salt for buffering, e.g., ammonium nitrate or a water-soluble alkyl-substituted ammonium nitrate such as tetramethylammonium nitrate; phosphoric acid, sulfuric acid, and/or nitric acid, preferably nitric acid, in an amount sufficient to adjust the pH to between about 1.5 to about 3; and water. For example, an exemplary composition useful for copper oversputter comprises, consists essentially of, or consists of: from about 2% to about 4% by weight of periodic acid; from about 1.5% to about 5% by weight of alumina abrasive, silica abrasive, or both, preferably alumina abrasive; from about 0.3% to about 2% by weight of ammonium nitrate; nitric acid in an amount sufficient to adjust the pH to between about 1.6 to about 2.5, preferably from about 1.8 to about 2.2; and the balance water.

A most preferred composition for use with copper oversputter comprises, consists essentially of, or consists of: from about 2.4% to about 2.8%, e.g., about 2.6%, by weight of periodic acid; from about 2.5% to about 3%, e.g. about 2.8%, by weight of alumina abrasive; from about 0.9% to about 1.4%, e.g., about 1.1%, by weight of ammonium nitrate, nitric acid in an amount sufficient to adjust the pH to about 1.9 to about 2.1; and the balance water.

Also in these embodiments, the composition can alternately consist essentially of: hydrogen peroxide; acetic acid; optionally an additional pH controlling agent; optionally an abrasive; and the balance water. In this embodiment in particular, the optional abrasive can be an iron-coated silica abrasive present in an amount from about 0.1% to about 35% by weight, and no additional pH controlling agent is present. In this embodiment in particular, the optional abrasive can additionally or alternately be an iron-coated silica abrasive present in an amount such that the iron content in the composition is from about 0.001% to about 1%.

Also in these embodiments, the composition can alternately consist essentially of: peracetic acid; optionally a pH controlling agent; an iron-coated silica abrasive; and the balance water. In this embodiment in particular, the optional abrasive can be an iron-coated silica abrasive present in an amount from about 0.1% to about 35% by weight, and no additional pH controlling agent is present. In this embodiment in particular, the optional abrasive can additionally or alternately be an iron-coated silica abrasive present in an amount such that the iron content in the composition is from about 0.001% to about 1%.

In embodiments where the composition comprises an abrasive, the abrasive can advantageously have an average particle size from about 10 nm to about 2 microns.

In another embodiment, the method further comprises changing the composition of the polishing composition during the step of movably contacting movably contacting the polishing or etching composition with the substrate, in order to facilitate a more controllable end-point, to form a relatively planar surface, to form a relatively low-defect surface, or a combination thereof. This step of changing the composition can, in one embodiment, include transitioning between two separate polishing compositions, a first polishing composition and a second polishing composition, each having different compositions. In one variant of this embodiment, the first and second polishing compositions are different in one or more of the following ways:

1) the first polishing composition has a greater abrasive particle size than the second polishing composition;

2) the first polishing composition has a greater amount of abrasive particles than the second polishing composition;

3) the first polishing composition has a greater amount of oxidizer than the second polishing composition;

4) the first polishing composition has a stronger oxidizer than the second polishing composition;

4) the first polishing composition has a lower pH than the second polishing composition (and thereby adjusting the effectiveness of the oxidizer); and/or 5) the second polishing composition has a greater amount of free radical quenchers, corrosion inhibitors, and/or film-forming agents than the first polishing composition. The first and second compositions can be discrete compositions, or the change from the first to the second composition can be gradual.

In preferred embodiments, the second composition is created by adding selected additives to the first composition. For example, changing the composition comprises one or more of the following: adjusting the pH of the composition by adding one or more pH controlling agents; adjusting the dilution level of the composition by adding diluent, or both. Other changes that can be effected include: removing at least some of any catalysts and accelerators present, adding a free radical quencher, a complexing agent, a film-forming agent, a hydroxyl-containing amine, and/or a non-hydroxyl-containing amine, or a combination thereof.

DETAILED DESCRIPTION OF THE PREFERRED EMBODIMENTS

The invention comprises a method for etching and/or chemically mechanically polishing a substrate having at least a first relatively conductive, metal-containing (e.g., overfilled and/or oversputtered) layer material disposed over a relatively non-conductive (e.g., dielectric, polymeric, or the like) layer, which method comprises the steps of:

providing a polishing or etching composition capable of polishing, etching, and/or removing the metal-containing layer material at a relatively high polishing rate; and movably contacting the polishing or etching composition with the substrate under conditions where at least a portion of the first metal-containing layer is removed to form first regions of material having substantially the same composition as the metal-containing layer and second regions of material having substantially the same composition as the relatively non-conductive layer.

In one embodiment, at least portions of the relatively conductive material are interconnected with other portions of relatively conductive material from the same first metal-containing layer or from a second metal containing layer disposed over the non-conductive layer on the opposite side from the first relatively conductive layer, such that a relatively conductive interconnection is formed therebetween.

As used herein, the term "relatively conductive," particularly with reference to a material, should be understood to mean that the material in general has a conductivity sufficient for integrated circuit manufacture. As used herein, the term "relatively non-conductive," particularly with reference to a material, should be understood to mean that the material in general has a resistivity sufficient for integrated circuit manufacture.

The polishing or etching composition can contain any oxidizing agent, so long as the composition is capable of removing the overfilled and/or oversputtered metal-containing layer material at a rate of at least about 200 nm/minute, preferably at least about 300 nm/minute, for example at least about 500 nm/minute or at least about 1 micron/minute. Advantageously, the polishing or etching composition according to the invention can remove the overfilled and/or oversputtered metal-containing layer material at a rate from about 1 micron/minute to about 50 microns/minute, for example from about 2 microns/minute to about 45 microns/minute, from about 3 microns/minute to about 40 microns/minute, from about 5 microns/minute to about 35 microns/minute, from about 10 micron/minute to about 40 microns/minute, from about 3 microns/minute to about 12 microns/minute, from about 20 microns/minute to about 50 microns/minute, or from about 4 microns/minute to about 32 microns/minute.

The polishing or etching composition according to the invention can contain any suitable oxidizing agent. Suitable oxidizing agents can include, but are not limited to, oxidized halides (e.g., chlorates, bromates, iodates, perchlorates, perbromates, periodates, fluoride-containing compounds, and the like, and mixtures thereof), per-compounds (e.g., perboric acid, periodic acid, periodates, perborates, percarbonates, persulfates such as ammonium persulfate, peroxides, peroxyacids (e.g., peracetic acid, perbenzoic acid, m-chloroperbenzoic acid, salts thereof, mixtures thereof, and the like), permanganates, and the like, and mixtures thereof), nitrates (e.g., iron (III) nitrate, hydroxylamine nitrate, and the like, and mixtures thereof), chromates, cerium compounds, ferricyanides (e.g., potassium ferricyanide), mixtures thereof, hydroxylamine, hydroxylamine derivatives and/or salts thereof (e.g., N-methyl-hydroxylamine, N,N-di methyl-hydroxylamine, N-ethyl-hydroxylamine, N,N-diethyl-hydroxylamine, methoxylamine, ethoxylamine, N-methyl-methoxylamine, as well as salts of hydroxylamine or hydroxylamine derivatives such as sulfate salts, nitrate salts, carbonate salts, phosphate salts, acetate salts, chloride salts, and the like, and a combination thereof), or the like. Suitable oxidizing agents may also include mixtures of two or more of the above-listed oxidizers, e.g., when two of the above are used, they may be employed in a ratio from about 100:1 to about 1:100.

The amount of oxidizer is typically between about 0.1% and about 30% by weight, e.g., from about 0.5% to about 20% by weight of the polishing or etching composition. In one embodiment, the polishing or etching composition can contain an oxidizer in an amount from about 1% to about 15%, alternately from about 3% to about 10%, from about 5% to about 20%, from about 1% to about 10%, from about 2% to about 14%, or from about 6% to about 13%, by weight of the polishing or etching composition.

In a preferred embodiment, the polishing or etching composition comprises, or consists essentially of, a single per compound oxidizer, which is preferably periodic acid or peracetic acid. As used herein, and unless otherwise specified, a per acid compound should be understood to mean the acid and/or a salt thereof. For example, "periodic acid," unless otherwise specified, includes the acid itself and/or a periodate salt (e.g., a monovalent salt such as ammonium and/or quaternary ammonium is/are preferred; although metal salts such as sodium, lithium, and/or potassium are additionally or alternately contemplated, their potential contamination of the substrate, especially for semiconductor substrates, makes them typically less preferred). Nevertheless, the polishing or etching composition may comprise or consist essentially of the per acid (e.g., periodic acid) itself and may be substantially free from the per acid salts. Alternately, the polishing or etching composition may comprise or consist essentially of a monovalent per acid (e.g., periodate) salt, as described above, and may be substantially free from the per acid (e.g., periodic acid) itself.

The polishing or etching composition according to the invention also advantageously include a majority of a diluent. While this diluent is preferably aqueous and more preferably consists essentially of, or consists of, water, it is also contemplated that the diluent can include other relatively non-reactive organic solvents. Examples of such solvents include, but are not limited to, pyrrolidinones such as N-methylpyrrolidinone, sulfoxides such as dimethylsulfoxide, sulfones such as methyl sulfone, amides such as lactams or dimethylacetamide, esters such as lactones, ethers such as tetrahydrofuran, glycols such as propylene glycol, and the like, and combinations thereof. In a preferred embodiment, the slurry composition according to the invention is substantially free of organic solvents.

The preferred diluent is water. In a preferred embodiment, the polishing or etching composition comprises the diluent, preferably water, in an amount of at least about 65% by weight, preferably at least about 70% by weight, for example at least about 75% by weight, at least about 80% by weight, or at least about 85% by weight. In another embodiment, the polishing or etching composition comprises the diluent, preferably water, in an amount from about 70% to about 99% by weight, alternately from about 80% by to about 97% by weight or from about 85% to about 96% by weight.

In some embodiments, between about 10% and about 100% of the water can be replaced with one or more polar organic solvents. Organic solvents may be either polar or non-polar. Generally, non-polar organic solvents are not preferred, though polar organic solvents, such as high boiling alcohols and the like, may be used. In one embodiment, therefore, the slurry compositions according to the invention can be substantially free from non-polar organic solvents. Examples of polar organic solvents include, but are in no way limited to, dimethyl sulfoxide, ethylene glycol, organic acid alkyl (e.g., $C_1$-$C_6$) esters such as ethyl lactate, ethylene glycol alkyl ethers, diethylene glycol alkyls ethers (e.g., monomethyl ether, monoethyl ether, monopropyl ether, monobutyl ether, etc.; dimethyl ether, diethyl ether, dipropyl ether, dibutyl ether, etc.; methyl ethyl diether, methyl propyl diether, methyl butyl diether, ethyl propyl diether, ethyl butyl diether, propyl butyl diether, etc., and the like), triethylene glycol alkyl ethers, propylene glycol, propylene glycol alkyl ethers, dimethyl sulfoxide, N substituted pyrrolidones such as N-methyl-2-pyrrolidone (NMP), sulfolanes, dimethylacetamide, and the like, water (considered a polar organic solvent herein), or any combination thereof. Dimethylacetamide and diethylene glycol alkyl ethers (most notably diethylene glycol monobutyl ether) are preferred polar organic solvents. Others include amine compounds and/or alkanolamine compounds, e.g., two carbon atom linkage alkanolamines such as AEEA and the like.

In one embodiment where polar organic solvents are present, the boiling point of the polar organic solvent(s) is(are) at least about 85° C., alternately at least about 90° C. or at least about 95° C. Care must be taken because, in the absence of alkanolamines and the like, certain organic solvents may be only slightly miscible with water, if present, in the dilute fluoride solution according to the invention. In one embodiment, at least one polar organic solvent is present in either or both of the polishing slurries in a total amount of at least about 65% by weight, preferably at least about 70% by weight, for example at least about 75% by weight, at least about 80% by weight, or at least about 85% by weight. In another embodiment, the total amount of polar organic solvent(s) can be from about 70% to about 99% by weight, alternately from about 80% by to about 97% by weight or from about 85% to about 96% by weight.

The polishing and/or etching composition according to the invention can be used in conjunction with any suitable component(s) (or ingredient(s)) known in the art, which may be present in the slurry composition or may be contained separately to be admixed therewith at the point of use. Examples of other components/ingredients can include, but are not limited to, abrasives, other oxidizing agents, non-hydroxyl-containing amines, hydroxyl-containing amines such as alkanolamines, catalysts, film-forming agents (e.g., corrosion inhibitors), complexing agents (e.g., chelating agents), free radical quenchers, rheological control agents, surfactants (e.g., surface-active agents), polymeric stabilizers, bases or acids to control pH, relatively non-abrasive additives that are relatively insoluble in the diluent, and other appropriate ingredients, as well as combinations thereof. However, in some embodiments, the polishing or etching composition can be substantially free from one or more of the other components or ingredients listed above.

The term "substantially," as used herein, means at least about 99%, preferably at least about 99.5%, more preferably at least about 99.9%, for example at least about 99.99%. In a preferred embodiment, the term "substantially" can mean completely, or about 100%. Therefore, the term "substantially free from," as used herein, means having not more than about 1%, preferably not more than about 0.5%, more preferably not more than about 0.1%, for example not more than about 0.01%. In a preferred embodiment, the term "substantially free from" can mean completely free from, or having about 0% of, the particular component(s)/ingredient(s).

The polishing or etching composition can optionally contain (and preferably does contain) an abrasive, such that the composition can be used for chemical mechanical polishing/planarization. The abrasive can include abrasive particles, an abrasive polishing pad, or both. Suitable examples of abrasive particles can include, but are not limited to, diamond, silica, ceria, alumina, magnesia, titania, zirconia, yttria, beryllia, germania, tungsten oxide, tantalum oxide, iron oxides, manganese oxide, nitrides of the aforementioned oxides, oxynitrides of the aforementioned oxides, carbides of the aforementioned oxides, or the like, or some combination thereof. For example, alumina abrasive particles typically remove copper material from substrate layers faster than silica abrasive particles, at similar concentrations. Additionally or alternately, the abrasive(s) can be natural, synthetic, fumed, precipitated, colloidal, at least partially hydrated, at least partially functionalized, doped, at least partially ionically charged, metal-coated (e.g., iron-coated and/or those disclosed in co-pending U.S. application Ser. No. 10/361,822, filed Feb. 11, 2003, which is hereby incorporated by reference in its entirety), polymer-coated, or the like, or some combination thereof, With regard to removal rates of copper substrate layers, for example, all silica abrasive particles are not alike; fumed silica tends to remove copper more rapidly than colloidal silica, at similar concentrations, and the combination of fumed silica with colloidal silica has a copper removal rate that is intermediate between the two.

When present, the abrasive particles in the composition according to the invention can have any suitable average particle size and/or particle size distribution such that the composition, as a whole, is capable of relatively rapidly removing overfilled and/or metal-containing material/layers from a substrate. Advantageously, the average particle size of the abrasives can be from about 5 nm to about 5 microns, for example from about 10 nm to about 2 microns, from about 5 nm to about 350 nm, from about 30 nm to about 1 micron, from about 50 nm to about 500 nm, from about 300 nm to about 3 microns, from about 10 nm to about 200 nm, or from about 750 nm to about 4 microns. The specific surface area of the abrasives can vary widely, for example, between about 1 and about 2000 square meters per gram, as measured by BET.

In another embodiment, the abrasive may be relatively non-spherical, or cocoon-shaped, which is generally defined in the industry as a particle where the length component is a factor of about two or three times the width component. While it is possible to form cocoon-shaped particles of a single matrix, it is preferred to form the cocoon-shaped particles from 2 to 3 loosely bound smaller particles. One composition has abrasive particles that are cocoon-shaped where 2 to 3 individual particles forming the cocoon are of an average size of between about 10 and 100 nanometers, for example between 15 and 25 nanometers.

The abrasive particles may form aggregates, which are particles loosely or strongly held together in clumps, where the number of particles in an aggregate depends largely on the chemistry of the composition and on the particle size. Aggregates typically have substantially the same dimensions, plus or minus 70%, measured in each direction, and typically have a plurality of particles interconnected such that a plurality of particles contact at least three other particles. Such aggregates can be desirable in certain circumstances, because they have high polishing rates as found with bigger particles but also have some resiliency, which reduces gouging. Particularly preferred for substrates having very fine features (e.g., features having a size of not more than about 0.25 microns or less) are abrasives in aggregate form with a particle size of 15 nanometers (0.015 microns) with an aggregate size of 0.03 to 0.05 microns, or abrasive with a particle size of 7 nanometers (0.007 microns) with an aggregate size of 0.02 to 0.04 microns.

When present, the amount of abrasive in the composition according to the invention can range from about 0.1% to about 30% by weight, preferably from about 0.1% to about 15%, e.g., from about 0.1% to about 5%, from about 5% to about 15%, from about 1% to about 10%, from about 8% to about 12%, from about 1% to about 7%, from about 0.1% to about 1%, or from about 0.5% to about 3%.

When the composition is used as an etchant (e.g., chemical polishing), an abrasive is generally not contained therein, and the composition according to the invention can be used as a static etchant. Static etchants, however, generally exhibit removal rates that are lower for a given substrate than when some mechanical and/or abrasive action is introduced (e.g., a polishing pad and/or abrasive particles).

Nevertheless, when a faster removal rate than available by mere static etching is desired, the etching composition according to the invention can be admixed with a separate polishing slurry, and optionally an additional diluent, to form a CMP slurry admixture. In this case, the separate etching composition advantageously contains an oxidizing agent in a desired amount, preferably the particular agent and particular amount being tailored to the specific substrate material to be planarized/polished and to the specific desired removal rate of that specific substrate material. The separate etching composition also generally contains a diluent, although this may not be necessary if a diluent is enclosed and/or added separately to the CMP slurry admixture. In such a case, the separate etching composition, the separate polishing slurry, and/or the optional diluent may contain one or more other components/ingredients, as disclosed herein. However, in some embodiments, the separate etching composition can consist essentially of, or consist of, merely an oxidizing agent and an optional diluent and/or the diluent can contain no other components/ingredients. Also in this case, the separate polishing slurry advantageously contains a diluent and abrasive particles in a desired amount, preferably the particular type of particle and particular amount being tailored to the specific substrate material to be planarized/polished and to the specific desired removal rate of that specific substrate material, as well as optionally one or more other components. Nevertheless, in some embodiments, the separate polishing slurry can consist essentially of, or consist of, merely abrasive particles, a diluent, and an optional pH controlling agent (e.g., an acid, base, or salt buffer). Therefore, the CMP slurry admixture can consist essentially of, or consist of, an etching composition according to the invention, a separate polishing slurry, and optionally a diluent.

When a CMP slurry admixture is used, the relative amounts of the oxidizer and the abrasive, based on the total weight of the admixture, can be different from the relative amounts in relation to the weight of the polishing slurry or etching composition according to the invention. For example, in a CMP slurry admixture according to the invention, the amount of abrasive can be from about 0.2% to about 20% by weight, preferably from about 0.5% to about 15%, for example from about 0.5% to about 5%, from about 1% to about 10%, from about 2% to about 12%, from about 4% to about 15%, from about 1% to about 6%, from about 0.5% to about 3%, or from about 2% to about 5%. For example, in a CMP slurry admixture according to the invention, the amount of oxidizer can be from about 0.05% to about 10% by weight, preferably from about 0.1% to about 8%, for example from about 0.1% to about 4%, from about 0.5% to about 7%, from about 1% to about 6%, from about 0.1% to about 1%, from about 2.5% to about 5%, from about 0.2% to about 3%, from about 0.5% to about 3%, or from about 0.7% to about 2.5%.

Advantageously, the pH of a CMP slurry admixture according to the invention can be from about 1 to about 10, preferably from about 1.5 to about 8, for example from about 7 to about 8, from about 1.5 to about 7, from about 2 to about 5, from about 6.5 to about 8, from about 3 to about 7, from about 1.5 to about 4.5, from about 4 to about 8, or from about 2 to about 6, or alternately from about 6 to about 10, or alternately from about 7 to about 10.

Optionally, the composition according to the invention can contain a surfactant and/or polymeric stabilizer, e.g., such as those disclosed in U.S. Pat. No. 5,527,423, in an amount from about 0.01% to about 3%, for example from about 0.1% to about 0.5%, from about 0.01 to about 0.1%, or from about 0.5% to about 3%, by weight. In one preferred embodiment, the surfactant polymeric stabilizer comprises an oligomeric and/or (co)polymeric polyacid (e.g., polyacrylic acid; a polyalkacrylic acid such as polymethacrylic acid; polymaleic acid; a copolymer thereof, for example with an inert comonomer such as ethylene; an anhydride thereof; or the like), or an at least partially neutralized non-metal salt thereof (e.g., an ammonium salt, a quaternary ammonium salt, or the like). In an alternate embodiment, the composition can be substantially free from surfactants/polymeric stabilizers.

The polishing or etching composition may optionally contain chelators. Examples of chelating agents include, but in no way limited to, mono-, di-, or multi-hydroxybenzene-type compounds, e.g., such as catechol, resorcinol, butylated hydroxytoluene ("BHT"), and the like, or a combination thereof. In one embodiment the chelators include three or more carboxylic acid-containing moieties. e.g., such as ethylenediamine tetraacetic acid ("EDTA"), nonmetallic EDTA salts (e.g., mono-, di-, tri-, or tetra-ammonium EDTA, or the like), and the like, or a combination thereof, Compounds containing a two carboxylic acid moieties are less preferred Compounds containing both hydroxyl and carboxylic acid moieties are useful in one embodiment. Aromatic compounds containing thiol groups, e.g., such as thiophenol; amino-carboxylic acids; diamines, e.g., such as ethylene diamine; polyalcohols; polyethylene oxide; polyamines; polyimines; or a combination thereof, are useful in one embodiment. In one embodiment, one or more chelating agents can be used in one composition, where the chelating agents are selected from groups described above. Alternately or additionally, some chelating agents are described in U.S. Pat. No. 5,417,877, issued May 23, 1995 to Ward, and in commonly assigned U.S. Pat. No. 5,672,577, issued Sep. 30, 1997 to Lee, the disclosures of each of which are incorporated herein by reference. In one embodiment, a chelating agent is present in the composition according to the invention in an amount from about 0.1% to about 10%, alternately from about 1% to about 10%, from about 0.5% to about 5%, from about 0.5% to about 3%, from about 0.1% to about 2%, from about 0.25% to about 0.75%, from about 1% to about 3%, or from about 0.2 to about 3% by weight. In an alternate embodiment, the composition can be substantially free from chelating agents.

The compositions of this invention may comprise a soluble catalyst or accelerator, for example, a small, i.e., less than 0.1% by weight, amount of an iron salt, e.g., ferric nitrate. The composition may comprise a small amount of one or more accelerators, which, in addition to or instead of ferric salts, can include, but are not limited to, copper salts, silver salts, cerium salts, and the like. In some embodiments of the invention, the compositions of this invention are substantially free from such metal-based soluble accelerators. Other agents may be classified as catalysts/accelerators, including, e.g., aminoacetic acid and/or amidosulfuric acid. Several classes of amine-containing polymer can be accelerators for selected substrates, including (1) an amine-containing polymer with about 5 or more sequential atoms separating the nitrogen atoms of the amino functional groups and/or (2) an amine-containing block copolymer with at least one polymer block comprising one or more amine functional groups and at least one polymer block not comprising any amine functional groups, e.g., a polyaminoamide of molecular weight between 1000 and 20000. Such compounds, if present, are beneficially present in an amount less than 5%, for example in an amount between 0.1 and 2%, by weight of the composition. In an alternate embodiment, the composition can be substantially free from such catalysts and/or accelerators.

Any suitable rheological control agent can be used in conjunction with the Composition or method, including viscosity enhancing agents and coagulants. Suitable rheological control agents can include, e.g. polymeric rheological control agents. Moreover, such rheological control agents can include, but are not limited to, urethane polymers (e.g., urethane polymers with a molecular weight greater than about 100,000 Daltons), acrylates comprising one or more acrylic subunits (e.g., vinyl acrylates and styrene acrylates), and polymers, copolymers, and oligomers thereof and salts thereof. In another embodiment, the compositions of this invention are substantially free from such rheological agents.

Any suitable film-forming agent (e.g., corrosion-inhibitor) can be used in conjunction with the inventive method. For example, suitable film-forming agents can generally include surface-active agents that preferentially adsorb to selected portions of the substrate. Therefore, suitable film-forming agents include, but are not limited to, amine-containing compounds such as primary, secondary, tertiary, and quaternary amines and amino acids, alkylamines, alkanolamines, hydrylalamines, phosphate esters, sodium laurylsulfate, fatty acids, polyacrylates, polymethacrylates, polyvinylphosphonates, polymalate, polystyrenesulfonate, and polyvinylsulfonate. Other suitable film-forming agents can include, for example, benzotriazole, triazole, benzimidazole, and mixtures thereof. In another embodiment, the compositions of this invention are substantially free from, e.g., completely free from, such film-forming agents/corrosion inhibitors.

Free radical quenchers according to the invention include those compounds capable of effectively quenching a free radical (e.g., a hydroxyl radical). These free radical quenchers can include such categories of components as: virtually all chelators, certain amines (hydroxyl- and non-hydroxyl-containing), and certain film-forming agents (corrosion inhibitors). Whenever possible, it is preferred that free radical quencher components represent non-chelating free radical quenchers (and more preferably also free radical quenchers that do not fall in any other predetermined group such as amines, film-forming agents, and the like), so as not to unduly overlap with these other categories of compounds. As used herein, the term "non-chelating free radical quencher" is intended to refer to a compound that does not readily chelate or otherwise complex with a metal such as copper, but that is capable of reacting with a free radical species to retard its reactivity and thus protect the metal from corrosion. Especially useful non-chelating free radical (e.g., hydroxyl free radical) quenchers include, but are not limited to, ascorbic acid and/or derivatives and salts thereof; iodide compounds; carbonate compounds; secondary alcohols (e.g., isopropanol and the like); tertiary alcohols; diols and/or polyol compounds (e.g., glycerine, glycol compounds, and the like); cylcoalkenes (e.g., 1,3-cyclohexadiene and the like); metal hydride compounds (e.g., tin hydride and the like); humic acid and/or derivatives and salts thereof; aromatic compounds, unsaturated compounds; and diazenes (e.g., azobenzene compounds and the like). In one embodiment, the non-chelating free radical quencher comprises ascorbic acid, or Vitamin C. Additionally or alternatively, the non-chelating free radical quencher can include thiamine or Vitamin $B_1$ (3-[(4-amino-2-methyl-5-pyrimidinyl)methyl]-5-(2-hydroxyethyl)-4-methylthiazolium chloride), phosphoric acid, phosphorous acid, at least partial esters thereof, or combinations thereof. It will be appreciated that derivatives and precursors of these non-chelating free radical quenchers can also be used in the invention. In an alternate embodiment, the composition can be substantially free from such free radical quenchers.

In general, the pH of the composition according to the invention can be adjusted in any suitable manner, e.g., by adding a pH adjuster, regulator, or buffer. Inorganic acids capable of controlling pH include, but are not limited to, nitric acid, sulfuric acid, phosphoric acid, hydrochloric acid, or any combination thereof. Organic acids, including mono, di, and tri carboxylic acids, including for example citric acid, glycolic acid, oxalic acid, acetic acid, or any combination thereof can be used in place of or with the inorganic acids. Organic acids (and salts thereof, for example ammonium salts thereof) may provide a desirable buffering capacity to the slurry compositions. Suitable pH buffers can include acids, for example, mineral acids (e.g., nitric acid, sulfuric acid, phosphoric acid, and the like, and combinations thereof), inorganic acids, organic acids (e.g., acetic acid, citric acid, malonic acid, succinic acid, tartaric acid, oxalic acid, glycolic acid, and the like, and combinations thereof), and combinations thereof. Other suitable pH adjusters, regulators, or buffers can also include bases, for example, inorganic hydroxide bases (e.g., sodium hydroxide, potassium hydroxide, ammonium hydroxide, and the like), organic hydroxide bases (e.g., mono-, di-, tri-, or tetra-alkylammonium hydroxides, choline hydroxides, bis-choline hydroxide, tris-choline hydroxide, and the like, and combinations thereof), carbonate bases (e.g., sodium carbonate and the like), methyl methoxide, ammonia, and combinations thereof. In an alternate embodiment, the composition can be substantially free from such pH controlling agents.

Advantageously, the composition according to the invention can be substantially free of dissolved metals, especially transition metals, for example the slurry contains less than about 50 ppm, preferably less than about 10 ppm dissolved metals.

The polishing or etching composition according to the invention can be used in conjunction with any suitable substrate. In particular, the present invention can be used in conjunction with, inter alia, memory or rigid disks, metals (e.g., noble metals), interlayer dielectric constructs (ILDs), integrated circuits, semiconductor devices, semiconductor packaging, semiconductor wafers, wafer connectors, micro-electro-mechanical systems (MEMS), ferroelectrics, magnetic heads, piezoelectrics, polymeric films, and low and high dielectric constant (e.g., low-K and high-K) films, technical or optical glass, or some combination thereof. For example, the polishing slurries according to the invention may alternately be used to polish a semiconductor device in conjunction with shallow trench isolation (STI) processing, as set forth, for example, in U.S. Pat. Nos. 5,498,565, 5,721,173, 5,938,505, and 6,019,806, or in conjunction with the formation of an interlayer dielectric.

In one embodiment, a suitable substrate can include a semiconductor assembly substrate, for example, upon which two or more semiconductor substrates (e.g., wafers, chips, etc.) are disposed and optionally interconnected. Additionally or alternately, suitable substrates comprise, for example, a metal, metal oxide, metal composite, or mixtures thereof. Additionally or alternatively, the substrate can comprise, consist essentially of, or consist of any suitable metal. Suitable metals can include, but are not limited to, tungsten, titanium, aluminum, copper, tantalum, silver, gold, platinum, iridium, ruthenium, germanium, rhodium, palladium, osmium, and combinations (e.g., alloys or mixtures) thereof. Additionally or alternatively, the substrate can comprise, consist essentially of or consist of any suitable metal oxide. Suitable metal oxides include, for example, alumina, silica, titania, ceria, zirconia, germania, magnesia, and coformed products thereof, and mixtures thereof. Additionally or alternately, the substrate can comprise, consist essentially of, or consist of any suitable metal composite and/or metal alloy. Suitable metal composites and metal alloys include, for example, metal nitrides (e.g., tantalum nitride, titanium nitride, and tungsten nitride), metal carbides (e.g., silicon carbide and tungsten carbide), nickel-phosphorus, alumino-borosilicate, borosilicate glass, phosphosilicate glass (PSG), borophosphosilicate glass (BPS)), silicon/germanium alloys, and silicon/germanium/carbon alloys. Additionally or alternately, the substrate can comprise, consist essentially of, or consist of any suitable semiconductor base material. Suitable semiconductor base materials can include strained silicon, polysilicon, single-crystal silicon, poly-crystalline silicon, amorphous silicon, silicon-on-insulator, and gallium arsenide. Glass substrates can also be used in conjunction with the present invention including, but not limited to, technical glass, optical glass, and ceramics, of various types known in the art. Additionally or alternatively, the substrate can comprise PZT ($PbZr_xT_{1-x}O_3$), PLT, PLZT ($Pb_{1-y}La_yZr_xTi_{1-z}O_3$), SBT or BST ($Ba_xSr_{1-x}TiO_3$) where (0<x<1, 0<y<1), $PbTiO_3$, $SrTiO_3$, $SrBi_2Ta_2O_9$, $BaTiO_3$, $Ta_2O_5$, or the like, or a combination thereof.

The polishing or etching composition according to the invention are particularly useful on substrates containing a layer comprising copper, a copper alloy, and/or a copper compound.

The polishing or etching composition according to the invention can be used to polish any part of a substrate at any stage in the production of the substrate, not merely just in overfill/oversputter applications.

When involving an abrasive, the methods according to the invention can generally be conducted using any CMP apparatus known in the art, because the methods involve multiple steps, it may be preferable to utilize CMP apparatus having the ability to polish multiple substrates simultaneously, e.g., through the use of multiple polishing platforms, optionally with at least a first polishing platform being dedicated to using the first polishing slurry and with at least a second polishing platform being dedicated to using the second polishing slurry. Alternately, a CMP apparatus with a single polishing platform may be used, especially if the first and second polishing slurries are provided via separate feeder lines to the single platform at their respective stages of the methods according to the invention.

Any suitable polishing pad can be used in conjunction with the polishing or etching methods and compositions of the present invention. In particular, the polishing pad can be woven or non-woven and can comprise any suitable polymer of varying density, hardness, thickness, compressibility, ability to rebound upon compression, and compression modulus. The polishing pad used in conjunction with the present invention can preferably have a density from about 0.6 to about 0.95 g/cm$^3$, a Shore A hardness rating of less than about 100 (e.g., about 40 to about 90), a thickness of at least about 0.75 mm (e.g., about 0.75 to about 3 mm), compressibility of about 0 to about 10% (by volume), the ability to rebound to at least about 25% (by volume) (e.g., about 25% to about 100%) after compression at about 35 kPa, and/or a compression modulus of at least about 1000 kPa. Examples of suitable polymers for the polishing pad material can include, but are not limited to, polyurethanes, polymelamines, polyethylenes, polyesters, polysulfones, polyvinyl acetates, polyacrylic acids, polyacrylamides, polyvinylchlorides, polyvinylfluorides, polycarbonates, polyamides, polyethers, polystyrenes, polypropylenes, nylons, fluorinated hydrocarbons, and the like, and mixtures, copolymers, and grafts thereof. In one preferred embodiment, the polishing pad comprises a polyurethane polishing surface. The polishing pad and/or surface can be formed from such materials using suitable techniques recognized in the art, for example, using thermal sintering techniques. Furthermore, the polishing pad formed from such materials can be substantially porous (e.g., having open or closed pores) or substantially non-porous. Porous pads preferably have a pore diameter of about 1 to 1000 microns and a pore volume of about 15% to about 70%. The polishing pad and/or surface also can be perforated or unperforated to any degree. In another embodiment, the polishing pad can comprise a perforated polishing surface.

The polishing or etching method according to the invention can be performed at any desired temperature, which typically ranges from about 15° C. to about 90° C., preferably from about 20° C. to about 75° C., for example from about 25° C. to about 50° C., from about 20° C. to about 30° C., from about 20° C. to about 70° C., or from about 40° C. to about 75° C.

The polishing method according to the invention can advantageously include providing the composition according to the invention at a flow rate typically from about 20 mL/min to about 500 mL/min between a substrate and a polishing pad, preferably from about 50 mL/min to about 400 mL/min, e.g., from about 100 mL/min to about 300 mL/min or from about 125 mL/min to about 350 mL/min. These flow rates, designed for substrates having a diameter from about 3 to about 12 inches, preferably from about 6 to about 9 inches, in diameter may also be scaled to substrates of larger and/or smaller diameter, if desired.

The polishing method according to the invention can advantageously include applying a small amount of pressure to the polishing pad, for example from about 0.2 to about 15 psi, from about 0.5 psi to about 10 psi, from about 1 psi to about 7 psi, or from about 1 psi to about 5 psi. In these embodiments, the polishing pad can typically be moved relative to the substrate, for example by rotating the pad and/or rotating a platen on which the substrate is mounted at a given rate, which can advantageously be from about 10 rpm to about 400 rpm, preferably from about 25 rpm to about 300 rpm, for example from about 50 rpm to about 200 rpm or from about 50 rpm to about 150 rpm. Use of the compositions and processes of the present invention may reduce, minimize or eliminate imperfections, defects, corrosion, recession, and/or erosion that might otherwise appear on the substrate surfaces.

In one embodiment, the composition according to the invention can contain relatively small abrasive particles, while the composition is used in conjunction with a polishing pad in which abrasive grains are embedded (or to which they are attached, adhered, or the like). In this embodiment, the abrasive grains embedded in (or attached/adhered to) the polishing pad can advantageously have a particle size greater than that of the abrasive particles in the composition.

In one embodiment, the method of polishing and/or etching a substrate according to the invention can involve undertaking a polishing/etching step in which the polishing composition according to the invention changes composition toward the end of the polishing and/or as the layer beneath the overfilled layer is close to or appears at the surface of the substrate, advantageously using proportionate amounts of a first relative rapid polishing slurry and a second relative slow and/or relatively low-defect polishing slurry (e.g., so as to form a relatively planar substrate surface) on a single polishing platform in a weight percentage amount from about 0:100 to about 100:0 (e.g., through relative flow from different feed lines), depending upon whether the overfilled layer was thick or whether the layer disposed beneath the overfilled layer was exposed, respectively. In this alternate embodiment, the transition between polishing compositions can be controlled by a continuous process (e.g., through differential amounts of the first and second polishing slurries relative to each other, depending on how close the underlayer is to being exposed on the substrate surface, which can be transitioned using a gradient method). In one embodiment, the first and second polishing compositions are different in one or more of the following ways: the first polishing composition has a greater abrasive particle size than the second polishing composition; the first polishing composition has a greater amount of abrasive particles than the second polishing composition; the first polishing composition has a greater amount of oxidizer than the second polishing composition; the first polishing composition has a lower pH than the second polishing composition; and the second polishing composition has a greater amount of free radical quenchers, chelators, corrosion inhibitors, and/or film-forming agents than the first polishing composition.

As used herein, the term "relatively planar," particularly in reference to a surface or a region or portion of the surface, should be understood to mean that the surface, or region or portion thereof has high points and low points, the maximum difference between the highest point and the lowest point being less than about 500 mm, preferably less than about 200 nm, for example less than about 150 nm, less than about 100 nm, less than about 50 nm, less than about 20 nm, or less than about 10 nm. The term "relatively planar," however, should be understood not to include deliberate non-planar surface features, e.g., unfilled vias, unfilled trenches, raised indicia, raised patterns, or the like, or a combination thereof, nor even non-deliberate substrate edge effects. Such non-deliberate substrate edge effects can include, for example, but are not limited to material deficiency within a distance no larger than about 5% of the substrate diameter (or the substrate region or portion) from the edges of the substrate (or region or portion thereof); material excess within a distance no larger than about 5% of the substrate diameter (or the substrate region or portion) from the edges of the substrate (or region or portion thereof); or the like; or a combination thereof.

As used herein, the term "relative low-defect," particularly in reference to a surface or a region or portion of the surface, should be understood to mean that the surface, or region or portion thereof, has a defect area content (i.e., the ratio of the area swept out by a defect divided by the total area of the substrate, or portion or region thereof) of less than about 5%, preferably less than about 2%, for example less than about 1%, less than about 0.5%, less than about 0.1%, or less than about 0.01%. The term "relatively low-defect," however, should be understood not to include deliberate non-planar surface features, e.g., unfilled vias, unfilled trenches, raised indicia, raised patterns, or the like, or a combination thereof nor even non-deliberate substrate edge effects. Such non-deliberate substrate edge effects can include, for example, but are not limited to material deficiency within a distance no larger than about 5% of the substrate diameter (or the substrate region or portion) from the edges of the substrate (or region or portion thereof); material excess within a distance no larger than about 5% of the substrate diameter (or the substrate region or portion) from the edges of the substrate (or region or portion thereof); or the like; or a combination thereof.

In another alternate embodiment, the change in the polishing composition can be accomplished not by using two separate compositions, but merely by adjusting the pH (e.g., through addition of one or more pH controlling agents, optionally in addition to a diluent) at the point of use, by adjusting the dilution level to be greater than in the composition according to the invention, and/or by adjusting the effectiveness of the oxidizer/composition (e.g., through addition of free radical quenchers, chelators, corrosion inhibitors, polymeric stabilizers, and/or film-forming agents and/or through removal of catalysts), in order to facilitate a more controllable end-point (e.g., by slowing down the relatively rapid removal rate), to form a relatively planar surface, and/or to form a relatively low-defect surface.

In one embodiment, particularly where the oxidizer in the composition according to the invention comprises hydroxylamine, or a derivative or salt thereof, a pH adjustment is preferred. In another embodiment, particularly where the oxidizer in the composition according to the invention comprises a per compound such as a peroxide and/or a per acid (e.g., peracetic, periodic, or the like, or combination thereof), a dilution adjustment is preferred.

Components, compositions, and/or methods that are described in commonly assigned and co-pending U.S. Published Application Nos. 2003/0164471 A1 and 2003/0162398 A1, both to Small et al., each of which are hereby incorporated by reference in their entirety, are also contemplated as additionally or alternately being a part of the present invention, or one or more embodiments thereof.

EXAMPLES

Examples 1-7

Polishing or Etching Compositions According to the Invention

Example 1 is a CMP slurry admixture comprising a polishing slurry, an oxidizing solution, and a diluent (DI water), which can advantageously be mixed at point of use, e.g., in a ratio of about 1:1:1.7-2. The polishing slurry is commercially available from EKC Technology Inc. of Hayward, Calif., and contains about 0.8 wt % of a purely gamma-alumina abrasive, about 10 wt % of an abrasive that is a 90/10 mixture of gamma- and alpha-alumina, respectively, and that has an average particle size of about 100 nm, about 4.3 wt % of ammonium nitrate, less than about 0.1 wt % nitric acid (approximately 0.08 wt %), and the balance DI water. The oxidizing solution is also commercially available from EKC Technology Inc. of Hayward, Calif., and contains an aqueous solution of about 10 wt % periodic acid. Therefore, the resulting CMP slurry admixture has a pH of about 2 and contains about 0.2 wt % of the purely gamma-alumina abrasive, about 2.5-2.7 wt % of the 90/10 gamma/alpha mixed alumina abrasive, about 1.1-1.2 wt % of ammonium nitrate, trace nitric acid (e.g., about 0.02-0.03 wt %), about 2.5-2.7 wt % of periodic acid, and the balance water.

Example 2 is also a CMP slurry admixture comprising a polishing slurry, an oxidizing solution, and a diluent (DI water), which can advantageously be mixed at point of use, e.g., in a ratio of about 1:2:1. The polishing slurry is commercially available from EKC Technology Inc. of Hayward, Calif., and contains about 20 wt % of an abrasive that is a 90/10 mixture of gamma- and alpha-alumina, respectively, and that has an average particle size of about 100 nm, trace nitric acid (i.e., less than about 0.01 wt %), and the balance DI water. The oxidizing solution is also commercially available from EKC Technology Inc. of Hayward, Calif., and contains about 2 wt % of hydroxylamine, about 3 wt % of hydroxylamine sulfate, about 0.2 wt of citric acid, about 0.025 wt % of benzotriazole, about 4.2% of sulfuric acid, and the balance DI water. Therefore, the resulting CMP slurry admixture has a pH of about 3.2 and contains about 5 wt % of the 90/10 gamma/alpha mixed alumina abrasive, trace nitric acid, about 1 wt % of hydroxylamine, about 1.5 wt % of hydroxylamine sulfate, about 0.1 wt % of citric acid, about 0.012 wt % of benzotriazole, about 2.1% of sulfuric acid, and the balance DI water.

Example 3 is an etching composition containing about 0.5 wt % ammonium persulfate, with the balance being DI water. In other compositions according to the invention, ammonium sulfate can be present in the composition and/or in an oxidizing solution from about 0.1 wt % to about 5 wt % ammonium persulfate, and/or in an amount such that the pH of the composition and/or solution is in the range from about 2 to about 7.

Example 4 is also an etching composition containing about 0.007 wt % hydrogen peroxide, about 1.2 wt % acetic acid, and the balance DI water.

Example 5 is a CMP slurry admixture comprising a polishing slurry, an oxidizing solution, and a diluent (DI water), which can advantageously be mixed at point of use. The polishing slurry contains about 1.2 wt % of acetic acid, based on the weight of the CMP slurry admixture, as well as about 0.3 wt % of iron-coated silica abrasive, based on the weight of the CMP slurry admixture, and/or an amount of iron-coated silica such that the iron content of the CMP slurry admixture is about 60 ppm, with the balance being DI water. The iron-coated silica of this Example has an average particle size of about 80 nm. The oxidizing solution contains about 0.007 wt % hydrogen peroxide, based on the weight of the CMP slurry admixture, with the balance being DI water. In other compositions according to the invention, hydrogen peroxide can be present in the composition and/or in an oxidizing solution in an amount from about 0.1% to about 10% by weight. In other compositions according to the invention, iron-coated silica can be present in the composition and/or in a polishing slurry in an amount from about 0.1 wt % to about 35 wt %, and/or in an amount such that, at a coating percentage ranging from about 10% to about 100%, the iron content of the composition, slurry, and/or admixture is in the range from about 0.001% to about 1%.

Example 6 is a CMP slurry admixture comprising a polishing slurry, an oxidizing solution, and a diluent (DI water), which can advantageously be mixed at point of use. The polishing slurry contains about 0.3 wt % iron-coated silica abrasive, based on the weight of the CMP slurry admixture, and/or an amount of iron-coated silica such that the iron content of the CMP slurry admixture is about 60 ppm, with the balance being DI water. The iron-coated silica of this Example has an average particle size of about 80 nm. The oxidizing solution contains about 1.5 wt % of peracetic acid, based on the weight of the CMP slurry admixture (calculated to have approximately the same molar content of acetate groups and peroxide groups as in Examples 4-5 above), with the balance being DI water. In other compositions according to the invention, peracetic acid can be present in the composition and/or in an oxidizing solution in an amount from about 0.01% to about 10% by weight.

Example 7 is a CMP slurry admixture comprising a polishing slurry, an oxidizing solution, and a diluent (DI water), which can advantageously be mixed at point of use, e.g., in a slurry:oxidizer:diluent ratio of about 1: from about 0.5 to about 2: from about 0 to about 2. The polishing slurry is commercially available from EKC Technology Inc. of Hayward, Calif., and contains about 15 wt % of an abrasive that is a 90/10 mixture of gamma- and alpha-alumina, respectively, and that has an average particle size of about 1 micron, optionally a pH controlling agent if necessary to adjust the pH to about 7 to about 9, and the balance DI water. The oxidizing solution is also commercially available from EKC Technology Inc. of Hayward, Calif., and contains about 10% of periodic acid, with the balance being DI water.

Example 8

Method of Removing Copper According to the Invention

The compositions of Examples 1-6 were used in a standing etch experiment to evaluate their relative removal rates of copper from a substrate. The particular substrate was made of a metallic (copper) core that was about 300 microns thick (but could alternately be significantly thicker or thinner, if desired), with a polymeric or photoresist-type layer of about 10 micron thickness (but could alternately be significantly thicker or thinner, if desired) disposed over both sides above and below) of the core, and then with another metallic (copper) plating layer of about 20 to about 40 microns thickness (e.g., about 30-32 microns thick, but could alternately be significantly thicker or thinner, if desired) disposed over each polymeric/photoresist-type layer.

The time necessary for each Example composition to etch away both upper and lower metallic (copper) plating layers was measured at a temperature between about 20 and about 70° C., for example at about ambient temperature. These results are tabulated below.

| Example number | Time needed for total static etch |
|---|---|
| 1 | About 180 minutes |
| 2 | *<about 1% of layers etched in 5 hours |
| 3 | **about 50% of layers etched in 15 hours |
| 4 | About 305 minutes |
| 5 | About 300 minutes |
| 6 | About 120 minutes |

The compositions of Examples 1 and 6 performed the best, showing static etch rates of about 0.3 and about 0.5 microns/minute, respectively.

Example 9

Method of Removing Copper According to the Invention

The composition of Example 7 is used in a standard CMP polishing experiment to evaluate its relative removal rate of copper from the same substrate as detailed in Example 8. By increasing the size of the abrasive grains (e.g., at least about 10-fold, as compared to those abrasives of Examples 1, 2, 5, and 6) and by using a CMP method instead of a standing etch test, the relative slurry:oxidizer:diluent ratio for the composition of Example 7 is optimized to give a rapid removal rate and exhibits copper removal of at least about 20 microns/minute and preferably of at least about 30 microns/minute, for example of about 32 microns/minute, on the substrate detailed in Example 8.

Although the present invention is described with reference to certain preferred embodiments, it is apparent that modification and variations thereof may be made by those skilled in the art without departing from the spirit and scope of this invention as defined by the appended claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of materials, methods, and components otherwise used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims, and not limited to the foregoing description.

What is claimed is:

1. A method of chemical mechanical polishing of a substrate comprising the steps of:
   A) providing a substrate having a surface comprising copper disposed over a predominately dielectric layer;
   B) movably contacting the substrate with a chemical-mechanical-polishing composition under conditions where at least a portion of the copper is removed, wherein the method has a copper removal rate of at least about of at least about 2 microns per minute at a polishing pressure from about 0.1 to about 15 psi, and wherein the chemical-mechanical-polishing composition comprises:
   a) an oxidizer selected from the group consisting of a peroxide, periodic acid, peracetic acid, and ammonium persulfate, wherein the oxidizer forms free radicals;
   b) water,
   c) an amine-containing film-forming agent, and
   d) at least one non-chelating free radical quencher selected from an hydroxyl-containing amine, a polyol compound, an unsaturated cycloalkene having more than one carbon-carbon double bond, a diazene compound, an azobenzene compound, humic acid, and/or derivatives and salts thereof, with the proviso that the at least one non-chelating free radical quencher is not ascorbic acid, isopropanol, thiamine, or a glycol compound, and that the non-chelating free radical quencher is not the amine-containing film-forming agent, and wherein the amount of the non-chelating free radical quencher is sufficient to reduce the amount of corrosion of the polished copper surface.

2. The method of chemical mechanical polishing of claim 1 wherein the oxidizer is periodic acid.

3. The method of chemical mechanical polishing of claim 1 wherein the oxidizer is a peroxide.

4. The method of chemical mechanical polishing of claim 1 wherein the chemical-mechanical-polishing composition further comprises at least one of ascorbic acid, isopropanol, thiamine, or a glycol compound.

5. The method of chemical mechanical polishing of claim 1 wherein the chemical-mechanical-polishing composition further comprises ascorbic acid.

6. The method of chemical mechanical polishing of claim 1 wherein the free radical quencher comprises a hydroxyl-containing amine.

7. The method of chemical mechanical polishing of claim 1 wherein the free radical quencher comprises a polyol compound.

8. The method of chemical mechanical polishing of claim 1 wherein the free radical quencher comprises an unsaturated cycloalkene having more than one carbon-carbon double bond.

9. The method of chemical mechanical polishing of claim 1 wherein the free radical quencher comprises a diazene compound.

10. The method of chemical mechanical polishing of claim 1 wherein the free radical quencher comprises an azobenzene compound.

11. The method of chemical mechanical polishing of claim 1 wherein the free radical quencher comprises humic acid and/or derivatives and salts thereof.

12. The method of claim 1, further comprising changing the composition of the chemical-mechanical-polishing composition during the step of movably contacting the substrate.

13. The method of claim 12, wherein the step of changing the composition comprises transitioning between two separate polishing compositions, a first polishing composition and a second polishing composition, each having different compositions.

14. The method of claim 13, wherein the first and second polishing compositions are different in one or more of the following ways: the first polishing composition has a greater abrasive particle size than the second polishing composition; the first polishing composition has a greater amount of abrasive particles than the second polishing composition; the first polishing composition has a greater amount of oxidizer than the second polishing composition; the first polishing composition has a lower pH than the second polishing composition; and the second polishing composition has a greater amount of non-chelating free radical quenchers and/or film-forming agents than the first polishing composition.

15. The method of chemical mechanical polishing of claim 1 wherein the method has a copper removal rate of at least about 10 microns/minute.

16. The method of chemical mechanical polishing of claim 1 wherein the method has a copper removal rate of at least 4 microns/minute at a polishing pressure between about 0.3 psi to about 6 psi.

17. The method of chemical mechanical polishing of claim 1 wherein the method has a copper removal rate of at least about 3 microns/minute.

18. The method of chemical mechanical polishing of claim 1 wherein the amine-containing film-forming agent comprises benzotriazole, triazole, benzimidazole, or mixtures thereof.

19. The method of chemical mechanical polishing of claim 1 wherein the chemical-mechanical-polishing composition comprises a multi-hydroxybenzene compound.

20. A method for chemically mechanically polishing an overfilled substrate having at least copper disposed over a relatively non-conductive layer, which method comprises the steps of:
   providing a polishing or etching composition capable of polishing, etching, and/or removing the metal-containing layer material at a removal rate of about 2 microns/minute to about 45 microns/minute wherein the composition comprises: i) from about 0.1% to about 30% by weight of an oxidizer selected from the group consisting of a peroxide, periodic acid, peracetic acid, ammonium persulfate, or a combination thereof; ii) a majority of a diluent; iii) at least one non-chelating free radical quencher selected from an hydroxyl-containing amine, a polyol compound, an unsaturated cycloalkene having more than one carbon-carbon double bond, a diazene compound, an azobenzene compound, humic acid, and/or derivatives and salts thereof, with the proviso that the at least one non-chelating free radical quencher is not ascorbic acid, isopropanol, thiamine, or a glycol compound, and that the non-chelating free radical quencher is not the amine-containing film-forming agent, and iv) from about 0.1% to about 30% by weight of an abrasive; and
   movably contacting the polishing or etching composition with the substrate under conditions where at least a portion of the first metal-containing layer is removed to form first regions of material having substantially the same composition as said copper layer on a surface of the substrate, and to form second regions of material having substantially the same composition as said relatively non-conductive layer on a surface of the substrate.

* * * * *